(12) United States Patent
Silberberg et al.

(10) Patent No.: US 12,139,784 B2
(45) Date of Patent: Nov. 12, 2024

(54) VACUUM DEPOSITION FACILITY AND METHOD FOR COATING A SUBSTRATE

(71) Applicant: ArcelorMittal, Luxembourg (LU)

(72) Inventors: Eric Silberberg, Haltinne (BE); Bruno Schmitz, Nandrin (BE); Sergio Pace, Jodoigne (BE); Remy Bonnemann, Saint-Nicolas (BE); Didier Marneffe, Engis (BE)

(73) Assignee: ArcelorMittal, Luxembourg (LU)

( * ) Notice: Subject to any disclaimer, the term of this patent is extended or adjusted under 35 U.S.C. 154(b) by 472 days.

(21) Appl. No.: 16/770,872

(22) PCT Filed: Dec. 11, 2018

(86) PCT No.: PCT/IB2018/059858
§ 371 (c)(1),
(2) Date: Jun. 8, 2020

(87) PCT Pub. No.: WO2019/116215
PCT Pub. Date: Jun. 20, 2019

(65) Prior Publication Data
US 2020/0362450 A1 Nov. 19, 2020

(51) Int. Cl.
*C23C 14/24* (2006.01)
*C23C 14/56* (2006.01)

(52) U.S. Cl.
CPC ............ *C23C 14/24* (2013.01); *C23C 14/562* (2013.01); *C23C 14/564* (2013.01)

(58) Field of Classification Search
CPC ... C23C 14/56; C23C 14/562; C23C 16/4412; C23C 14/24–32
See application file for complete search history.

(56) References Cited

U.S. PATENT DOCUMENTS 3,531,319 A * 9/1970 Martorana ............ C23C 14/562
118/718
5,894,131 A * 4/1999 Fukunaga ............... C23C 14/48
250/441.11
(Continued)

FOREIGN PATENT DOCUMENTS

CN 107076538 A 8/2017
EP 2562288 A2 2/2013
(Continued)

OTHER PUBLICATIONS

International Search Report of PCT/IB2018/059858 of Mar. 7, 2019.

*Primary Examiner* — Aiden Lee
(74) *Attorney, Agent, or Firm* — Davidson Kappel LLC

(57) ABSTRACT

A vacuum deposition facility for continuously depositing, on a running substrate, coatings formed from metal or metal alloy, and including:
  a central casing including a vapor jet coater, the inner walls of the central casing being suited to be heated at a temperature above the condensation temperature of the metal or metal alloy vapors,
  a vapor trap located at the substrate exit of the central casing, the inner walls of the vapor trap being suited to be maintained at a temperature below the condensation temperature of the metal or metal alloy vapors,
  the passage linking the central casing to the vapor trap including at least one thermal connector extending at least from the inner walls of the central casing to the inner walls of the vapor trap.

31 Claims, 2 Drawing Sheets

(56) References Cited

U.S. PATENT DOCUMENTS

| | | |
|---|---|---|
| 8,435,352 B2 | 5/2013 | Schade Van Westrum et al. |
| 10,684,126 B2 | 6/2020 | Gang et al. |
| 2001/0010831 A1* | 8/2001 | Fuchs ................ C23C 14/0694 |
| | | 427/255.395 |
| 2001/0050053 A1 | 12/2001 | Umotoy et al. |
| 2002/0142095 A1 | 10/2002 | Motoyama et al. |
| 2002/0182845 A1 | 12/2002 | Miyano et al. |
| 2003/0037730 A1* | 2/2003 | Yamasaki ............... C23C 16/18 |
| | | 257/E21.17 |
| 2007/0218201 A1 | 9/2007 | Gottsman et al. |
| 2007/0240636 A1 | 10/2007 | Gottsman et al. |
| 2010/0104752 A1* | 4/2010 | Choquet ............... C23C 14/562 |
| | | 420/513 |
| 2012/0034733 A1* | 2/2012 | Sferlazzo .............. C23C 14/562 |
| | | 438/95 |
| 2012/0291708 A1 | 11/2012 | Bak et al. |
| 2013/0112288 A1* | 5/2013 | Liu ....................... C23C 14/243 |
| | | 137/334 |
| 2016/0222495 A1 | 8/2016 | Chaleix et al. |
| 2018/0258521 A1 | 9/2018 | Inoue et al. |

FOREIGN PATENT DOCUMENTS

| | | |
|---|---|---|
| JP | 2002294456 A | 10/2002 |
| JP | 2002359241 A | 12/2002 |
| JP | 2006007149 A | 1/2006 |
| JP | 2007534843 A | 11/2007 |
| KR | 20070011542 A | 1/2007 |
| KR | 101184679 B1 * | 9/2012 |
| RU | 2388846 C2 | 5/2010 |
| WO | WO97/47782 | 12/1997 |
| WO | WO2007054229 A1 | 5/2007 |
| WO | WO2017051790 A1 | 3/2017 |

\* cited by examiner

VACUUM DEPOSITION FACILITY AND METHOD FOR COATING A SUBSTRATE

The present invention relates to a vacuum deposition facility for depositing, on a substrate, coatings formed from metal or metal alloys such as for example zinc and zinc-magnesium alloys, said facility being more particularly intended for coating steel strip, without being limited thereto. The present invention also relates to the method for coating a substrate thereof.

BACKGROUND

Various processes for depositing metal coatings, eventually composed of alloys, on a substrate, such as a steel strip, are known. Among these, mention may be made of hot-dip coating, electrodeposition and also the various vacuum deposition processes, such as vacuum evaporation and magnetron sputtering.

It is known from WO97/47782 a method for the continuous coating of a steel substrate in which a metallic vapor spray, propelled at a speed greater than 500 m/s, comes in contact with the substrate. To improve the efficiency of this method, the corresponding vacuum deposition facility comprises a deposition chamber which inner walls are suited to be heated at a temperature high enough to avoid condensation of metal or metal alloys vapors on them.

Nevertheless, it has been observed that, at the exit of the deposition chamber, the thermal transition is so high that zinc tends to heavily condensate in the vicinity of the entry and exit openings around the metal strip. In case of a shift to a wider strip, the zinc build-up can impede the strip movement. To avoid such build-up, regular cleaning of the deposition chamber is mandatory, which significantly reduces the equipment productivity.

SUMMARY OF THE INVENTION

An aim of the present invention is to remedy the drawbacks of the facilities and processes of the prior art by providing a vacuum deposition facility that prevents condensation of metal or metal alloys vapors in the openings of the deposition chamber.

The present invention provides a vacuum deposition facility for continuously depositing, on a running substrate, coatings formed from metal or metal alloy, the facility comprising a vacuum chamber through which the substrate can run along a given path, wherein the vacuum chamber further comprises:
- a central casing comprising a substrate entry and a substrate exit located on two opposite sides of the central casing and a vapor jet coater, the inner walls of the central casing being suited to be heated at a temperature above the condensation temperature of the metal or metal alloy vapors,
- a vapor trap in the form of an external casing located at the substrate exit of the central casing, the inner walls of the vapor trap being suited to be maintained at a temperature below the condensation temperature of the metal or metal alloy vapors,
- the passage linking the central casing to the vapor trap comprising at least one thermal connector extending at least from the inner walls of the central casing to the inner walls of the vapor trap.

The facility according to the invention may also have the optional features listed below, considered individually or in combination:
- the thermal connector comprises a monobloc metallic piece;
- the metallic piece is made of a metal with a thermal conductivity above 20 W·m$^{-1}$K$^{-1}$,
- the metallic piece is in copper,
- the thickness of the thermal connector is comprised between 6 and 18 mm,
- the thermal connector is of uniform shape and extends over the entire width of the substrate exit of the central casing,
- the thermal connector is of rectangular cross-section,
- the thermal connector protrudes in the central casing and is in contact with the walls of the vapor trap,
- the thermal connector protrudes inwards from the inner wall of the central casing of a least 4 mm,
- the vapor trap comprises an inward side and the thermal connector does not extend beyond the plane of the inner wall of the inward side of the vapor trap,
- the vapor trap comprises an inward side, which is intended to contact the central casing, from which the thermal connector protrudes in the inward direction and is suited to be inserted in the cavity of the central casing,
- the substrate exit of the central casing comprises the thermal connector protruding from the substrate exit and suited to be put in contact with the walls of the vapor trap,
- the central casing comprises a local heater adjacent to the thermal connector,
- the vacuum deposition facility further comprises a second vapor trap located at the substrate entry of the central casing,
- the passage linking the central casing to the vapor trap comprises two thermal connectors, one below the substrate path and the other one above the substrate path,
- the thermal connector protrudes in the vapor trap and is in contact with the walls of the central casing.

The present invention also provides a kit for the assembling of a vacuum deposition facility for continuously depositing, on a running substrate, coatings formed from metal or metal alloy, the kit comprising
- a central casing comprising a substrate entry and a substrate exit located on two opposite sides of the central casing and the vapor outlet orifice of a vapor jet coater, the inner walls of the central casing being suited to be heated at a temperature above the condensation temperature of the metal or metal alloy vapors,
- a vapor trap in the form of an external casing suited to be located at the substrate exit of the central casing, the inner walls of the vapor trap being suited to be maintained at a temperature below the condensation temperature of the metal or metal alloy vapors,
- a thermal connector suited to be inserted in the substrate exit of the central casing and to extend at least from the inner walls of the central casing to the inner walls of the vapor trap.

As it will be explained, the invention is based on the control of a gradual thermal gradient starting at the exit of the central casing of the vacuum chamber thanks to the addition of at least one vapor trap and at least one thermal connector located in the passage linking the central casing to the vapor trap so that the exit of the central casing is kept at the temperature of the central casing whereas the thermal gradient occurs in the vapor trap only.

Other characteristics and advantages of the invention will be described in greater detail in the following description.

BRIEF DESCRIPTION OF THE DRAWINGS

The invention will be better understood by reading the following description, which is provided purely for purposes of explanation and is in no way intended to be restrictive, with reference to.

DETAILED DESCRIPTION

An aim of the present invention is to deposit, on a substrate, coatings formed from metal or metal alloys. The aim is in particular to obtain zinc or zinc-magnesium coatings. However, the process is not limited to these coatings, but preferably encompasses any coating based on one single metal or on a metal alloy whose elements have vapor pressures at the bath temperature not differing by more than 10%, as controlling their respective relative content is then facilitated.

To give an indication, mention may thus be made of coatings made of zinc, as main element, and additional element(s), such as chromium, nickel, titanium, manganese, magnesium, silicon and aluminum, considered individually or in combination.

The thickness of the coating will preferably be between 0.1 and 20 µm. On one hand, below 0.1 µm, there would be a risk that the corrosion protection of the substrate would be insufficient. On the other hand, it is unnecessary to go beyond 20 µm in order to have the level of corrosion resistance which is required, in particular, in the automotive or construction field. In general, the thickness may be limited to 10 µm for automotive applications.

Figure 1:
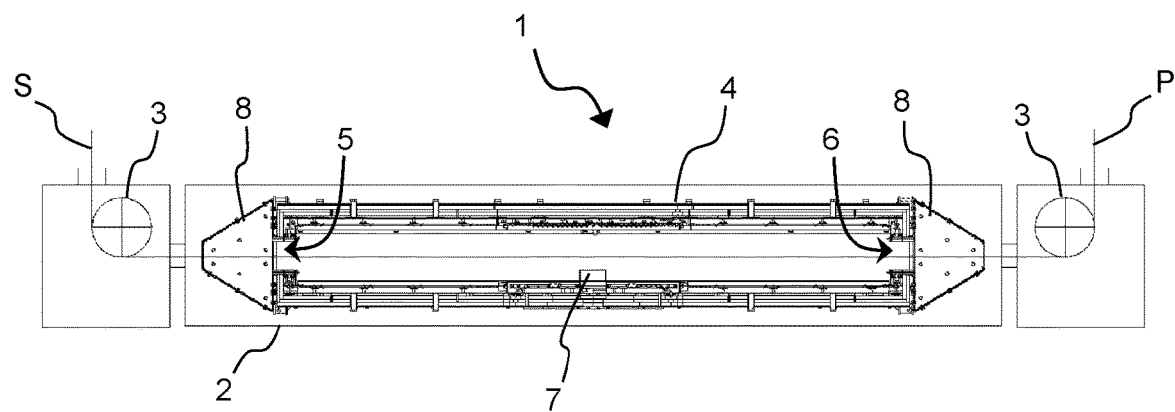
FIG. 1, which is a cross-section of an embodiment of a facility according to the invention.

With reference to FIG. 1, the facility 1 according to the invention first comprises a vacuum chamber 2 and a means for running the substrate through the chamber.

This vacuum chamber 2 is a hermetically-sealable box preferably kept at a pressure of between $10^{-8}$ and $10^{-3}$ bar. It has an entry lock and an exit lock between which a substrate S, such as for example a steel strip, can run along a given path P in a running direction.

The substrate S may be made to run by any suitable means, depending on the nature and the shape of said substrate. A rotary support roller 3 on which a steel strip can bear may in particular be used.

The vacuum chamber 2 comprises a central casing 4. This is a box surrounding the substrate path P on a given length in the running direction, typically 2 to 8 m long. Its walls delimit a cavity. It comprises two apertures, i.e. a substrate entry 5 and a substrate exit 6 located on two opposite sides of the central casing. Preferably the central casing is a parallelepiped which width is slightly larger than the substrates to be coated.

The walls of the central casing are suited to be heated. The heating may be made by any suitable means, such as for example an induction heater, heating resistors, or electron beam. The heating means are suited to heat the inner walls of the central casing at a temperature high enough to avoid condensation of metal or metal alloy vapors on them. Preferably, the walls of the central casing are suited to be heated above the condensation temperatures of the metal elements forming the coating to be deposited, typically above 500° C., for example between 500° C. and 700° C. so as to avoid the condensation of zinc vapors or zinc-magnesium alloy vapors. Thanks to these heating means, the inner walls of the central casing do not become clogged and the facility does not have to be frequently stopped for cleaning.

Figure 2:
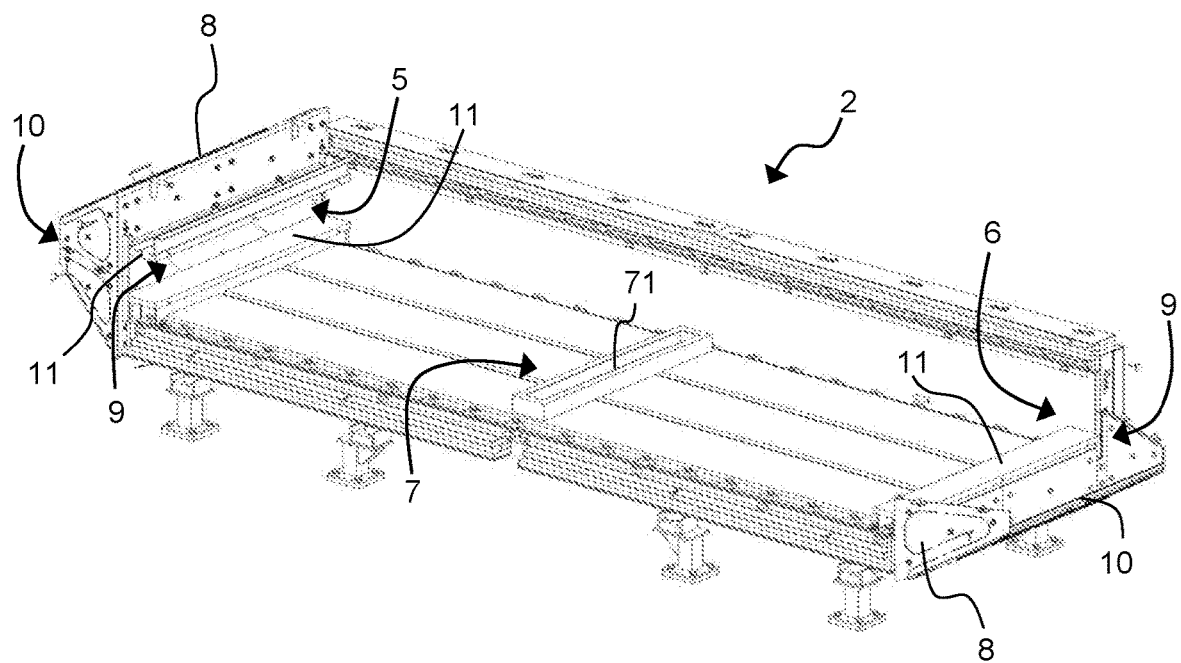
FIG. 2, which is a cutaway view of an embodiment of the vacuum chamber according to the invention FIG. 3, which is a cross-section of an embodiment of the junction between the central casing and the vapor trap of the invention It should be noted that the terms "lower", "beneath", "inward", "inwards", "outward", "outwards", "upstream", "downstream", . . . as used in this application refer to the positions and orientations of the different constituent elements of the facility when the latter is installed on a vacuum deposition line.

With reference to FIG. 2, the central casing 4 also comprises a vapor jet coater 7, preferably located on one side of the central casing parallel to the substrate path, beside the face of the substrate S which has to be coated. This coater is suited to spray a metal or metal alloy vapor onto the running substrate S. It can advantageously consist of an extraction chamber provided with a narrow vapor outlet orifice 71, the length of which is close to the width of the substrate to be coated.

The vapor outlet orifice 71 may have any suitable shape, such as a slot that can be adjusted lengthwise and widthwise for example. The possibility of adapting its length to the width of the substrate to be coated makes it possible to minimize the loss of evaporated metal.

The coater is preferably a sonic vapor jet coater, that is to say a coater capable of generating a vaporjet of sonic velocity. This type of coater is also usually referred to as a JVD (Jet Vapor Deposition) device. The reader may refer to the patent application WO97/47782 for a fuller description of one variant of this type of device. The coater can be coupled to any kind of metallic vapor generator such as, for example, an induction-heated evaporation crucible or an electromagnetic levitation vapor generator.

Preferably, the central casing is surrounded by insulating panels themselves preferably surrounded by cooling panels. This allows reducing heat loss in the vacuum chamber 2 and improving the energy performance of the central casing.

The vacuum chamber 2 also comprises a vapor trap 8 in the form of an external casing located at the substrate exit 6 of the central casing 4, i.e. located downstream of the central casing in the running direction of the substrate.

Preferably, the vacuum chamber 2 also comprises a second vapor trap 8 in the form of an external casing located at the substrate entry 5 of the central casing 4, i.e. located upstream of the central casing in the running direction of the substrate.

Each vapor trap 8 is a box surrounding the substrate path on a given length in the running direction, typically 0.2 to 7 m long, for example between 0.5 time and 3.5 time the substrate width. Its walls delimit a cavity. It comprises an inward opening 9 and an outward opening 10 located on two opposite sides of the vapor trap and suited to let the substrate enter and exit the vapor trap. The inward opening 9 is adjacent to the central casing while the outward opening 10 is at the opposite.

Preferably the vapor trap 8 has, in longitudinal cross-section, a trapezoid shape pointing in a direction opposite to the central casing. In that configuration, the trapezium base line is positioned vertically and adjacent to the central casing. Thanks to this position of the base line, the walls of the vapor trap around the aperture 5, 6 of the central casing are as much distant as possible from the aperture which further reduces the risk of clogging of the aperture due to metal deposition on cold walls of the vapor trap located in the vicinity of the aperture. In that configuration, the edges of the trapezium outwards converge so as to trap as much vapor as possible before the vapor exits through the outward opening 10.

The walls of the vapor traps 8 are suited to be thermally regulated. The heat regulation may be made by any suitable means, such as for example a cooling circuit supplied with a heat transfer fluid such as, for example, water or nitrogen. The heat regulation means are suited to maintain the inner walls of the vapor trap at a temperature low enough to favor condensation of metal or metal alloys vapors on the inner walls, typically below 100° C. Thanks to these heat regulation means, the metal or metal alloys vapors escaping the central casing are trapped and are not released in the vacuum chamber, which would, in that case, become clogged.

Each vapor trap 8 is in contact with the central casing 4. In particular, the inward opening 9 of the first vapor trap, respectively of the second vapor trap, is aligned with the substrate entry 5 of the central casing, respectively with the substrate exit 6 of the central casing, so as to form a passage linking the central casing to each vapor trap.

The passage linking the central casing to each vapor trap is suited to smoothen the thermal transition between the central casing and the vapor trap compared to the thermal transition that would have occurred if the passage had been the alignment of simple openings on straight walls.

Thanks to this smoothening, the apertures 5, 6 of the central casing are not cold spots where metal vapor preferably condensates. It is thus possible to drastically reduce the metal deposition at these places of the central casing and thus to avoid the clogging of the facility. Moreover, thanks to the removal of the cold spots, the vapors tend to condensate more on the substrate which increases the deposition yield.

Figure 3:
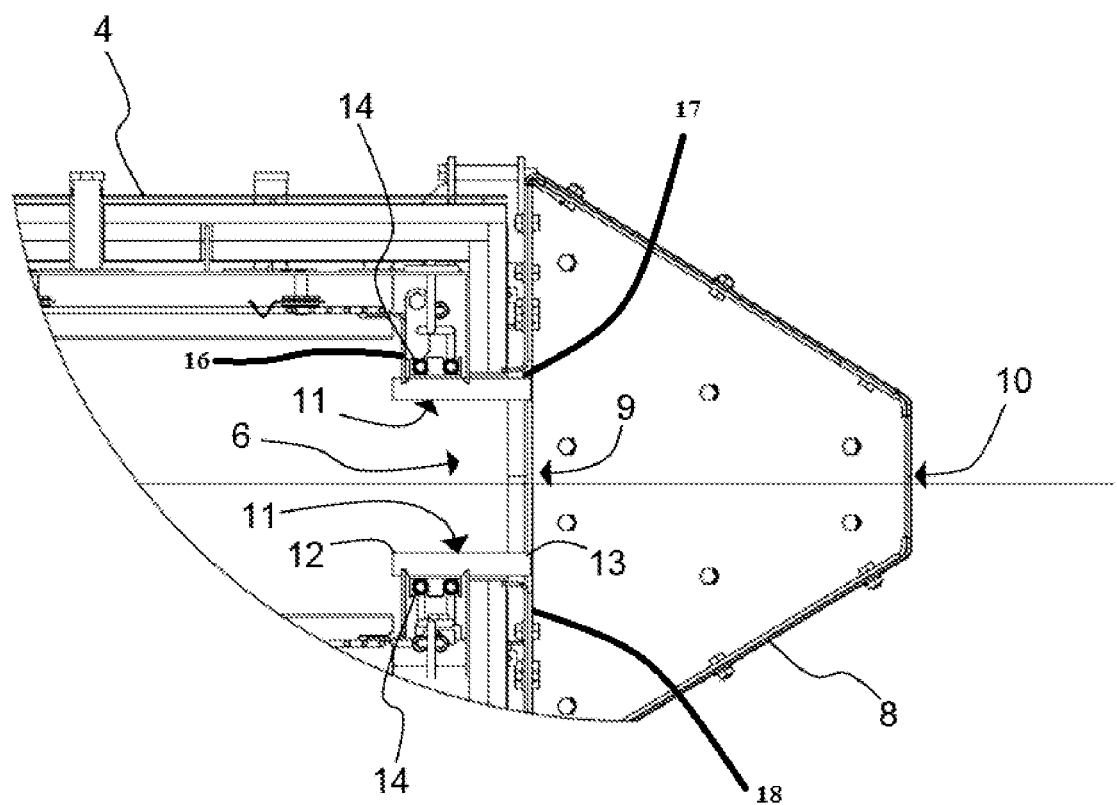

To do so, the passage linking the central casing to the vapor trap comprises at least one thermal connector 11 as illustrated on FIG. 3. The thermal connector comprises two ends, i.e. an inward end 12 and an outward end 13, i.e. one end in contact with the central casing and one end in contact with the vapor trap. The thermal connector 11 can be made by any suitable means suited to conduct heat from the central casing to the vapor trap while keeping the end of the thermal connector in contact with the central casing at a temperature above the condensation temperature of the metal or metal alloy vapor.

The thermal connector is heated by radiation in the central casing and heat is transmitted by conduction to the cold parts of the vapor trap.

The thermal connector preferably comprises a solid metallic piece. It can comprise several solid metallic pieces fitted to one another but one single piece is preferred to avoid singular points. The metallic piece is preferably made of a metal with a thermal conductivity above 20 $W \cdot m^{-1} K^{-1}$ such as, for example, copper, aluminum, stainless steel, brass. Copper is preferred as its high thermal conductivity helps reducing the length of the thermal connector, on the understanding that its length is in the running direction.

The thermal connector is preferably thicker than the sides of the vapor trap so that it is kept at the temperature of the central casing while it conducts heat to the vapor trap. The thickness of the thermal connector is preferably comprised between 6 and 18 mm so as to be efficiently heated by radiation in the central casing while not being too cooled by the vapor trap.

The thermal connector is preferably of uniform shape and extends over the entire width of the apertures 5 and/or 6 of the central casing 2. This favors a uniform temperature along the width of the substrate entry 5 or the substrate exit 6 and thus a uniform behavior of the metal vapor in the vicinity of the apertures of the central casing.

The thermal connector is preferably of rectangular cross-section to have an improved compromise between heating by the central casing and cooling by the vapor trap.

According to one embodiment of the invention, the passage linking the central casing to the vapor trap comprises at least one thermal connector 11 protruding in the central casing and in contact with the walls of the vapor trap.

According to one variant of this embodiment, the inward side of the vapor trap, which is intended to contact the central casing, comprises a thermal connector protruding from the inward side in the inward direction and suited to be inserted in the cavity of the central casing. In other words, the periphery of the inward opening 9 of the vapor trap comprises at least one thermal connector which extends outwards from the vapor trap.

Thanks to this protrusion of the thermal connector in the central casing, the inward end of the thermal connector is more easily kept at the temperature of the central casing, which reduces the risk of having its temperature decreased below the condensation temperature of the metal or metal alloy vapor.

As illustrated in FIG. 3, the first vapor trap 8, respectively the second vapor trap 8, can comprise two thermal connectors 11 at least partially inserted in the substrate entry 5 (see FIG. 2), respectively the substrate exit 6, of the central casing 4 and in contact with the outer wall 17 of the vapor trap. One thermal connector is inserted below the substrate path and the other one above the substrate path.

The length of the thermal connector is adjusted so that, once the central casing and the vapor trap are linked, the inward end 12 protrudes inwards from the aperture of the central casing. The length of the thermal connector is preferably adjusted so that, once the central casing and the vapor trap are linked, the inward end 12 protrudes inwards from the inner wall 16 of the central casing of at least 4 mm and more preferably between 6 and 60 mm.

The outward end 13 of the thermal connector preferably doesn't extend beyond the plane of the inner wall 18 of the inward side of the vapor trap. Thanks to this perpendicularity between the outward end and inner wall, the vapor exiting the central casing through the passage and entering the vapor trap condensate on walls located as far as possible from the passage, so that there is no metal build-up in the passage.

It has been observed that, in the case of metal alloys depositions requiring very high temperatures in the central casing, the thermal transition between the central casing and the vapor trap might be so high that the thermal conduction between the thermal connector and the cold parts of the vapor trap can cool down the thermal connector possibly at a temperature below which vapors condensate. To avoid this cooling of the thermal connector, the central casing preferably comprises an additional local heater 14 adjacent to the thermal connector. The local heater can be located adjacent to the inward end 12 of the thermal connector in the central casing or adjacent to the thermal connector in the thickness of the walls of the central casing. The local heater may be made by any suitable means such as, for example, an induction heater, a heating resistor.

According to another variant of this embodiment, the vacuum deposition facility differs from the first variant of this embodiment only in that the aperture 5 and/or 6 of the central casing, which is intended to contact the inward side of the vapor trap, comprises a thermal connector protruding from the aperture in the inward direction and suited to be put in contact with the walls of the vapor trap. In other words, the periphery of the aperture of the central casing comprises at least one thermal connector which extends inwards.

According to a second embodiment of the invention, the passage linking the central casing to the vapor trap comprises at least one thermal connector 11 protruding in the vapor trap and in contact with the walls of the central casing.

According to one variant of this embodiment, the aperture 5 and/or 6 of the central casing, which is intended to contact the inward side of the vapor trap, comprises a thermal connector protruding from the aperture in the outward direction and suited to be inserted in the cavity of the vapor trap. In other words, the periphery of the aperture of the central casing comprises at least one thermal connector which extends outwards.

The aperture 5 and/or 6 of the central casing can comprise two thermal connectors at least partially inserted in the inward opening of the vapor trap and in contact with the walls of the vapor trap. One thermal connector is inserted below the substrate path and the other one above the substrate path.

The length of the thermal connector is adjusted so that, once the central casing and the vapor trap are linked, its outward end 13 protrudes in the vapor trap from its inward opening. The length of the thermal connector is preferably adjusted so that, once the central casing and the vapor trap are linked, the outward end 13 protrudes from the inner wall of the vapor trap of at least 4 mm and more preferably between 6 and 60 mm.

The central casing 4 preferably comprises an additional local heater 14 adjacent to the thermal connector. The local heater can be located adjacent to the inward end 12 of the thermal connector in the central casing or adjacent to the thermal connector in the thickness of the walls of the central casing. The local heater may be made by any suitable means such as, for example, an induction heater or a heating resistor.

According to another variant of this embodiment, the vacuum deposition facility differs from the first variant of second embodiment in that the inward side of the vapor trap, which is intended to contact the central casing, comprises a thermal connector protruding from the inward side in the inward direction and suited to be inserted in the cavity of the central casing. In other words, the periphery of the inward opening 9 of the vapor trap comprises at least one thermal connector which extends inwards in the vapor trap.

According to a third embodiment of the invention, the passage linking the central casing to the vapor trap comprises at least one thermal connector 11 protruding in both the vapor trap and the central casing. The features as described in first and second embodiment apply to this third embodiment.

Tests have been performed on the vacuum deposition facility to assess the quantity of metal (in this case zinc) deposited in the two passages linking the central casing to the two vapor traps.

The quantity of zinc evaporated has been obtained by weighting the evaporation crucible, which feeds the vapor jet coater, before and after the test. The quantity of zinc deposited has been obtained by contacting the passages and the vapor traps with an acidic solution to dissolve zinc. The quantity dissolved was then measured by Inductively Coupled Plasma.

A first trial done on a 500 mm-wide steel substrate, with a vapor outlet orifice 71 10 mm wider than the steel substrate on each side of the substrate, at a pressure of $10^{-1}$ mBar, has shown that 1.473 g of zinc had been deposited on the thermal connectors for 13.5 Kg of zinc evaporated, which corresponds to a build-up yield of 0.0109%.

In comparison, a test performed on a facility without thermal connectors in the same conditions has shown that 1.835 g of zinc had been deposited at the inward opening 9 of the vapor traps, which corresponds to an increase of 25% of the build-up.

A second trial done on a 300 mm-wide steel substrate, in less favorable conditions, i.e. with a vapor outlet orifice 50 mm wider than the steel substrate on each side of the substrate, at a pressure of $10^{-1}$ mBar, has shown that 2.889 g of zinc had been deposited on the thermal connectors for 10.5 Kg of zinc evaporated which corresponds to a build-up yield of 0.0275%.

In comparison, a test performed on a facility without thermal connectors in the same conditions has shown that 4.915 g of zinc had been deposited at the inward opening 9 of the vapor traps, which corresponds to an increase of 70% of the build-up.

The facility according to the invention applies more particularly, but not solely, to the treatment of metal strips, whether precoated or bare. Of course, the process according to the invention may be employed for any coated or uncoated substrate, such as for example aluminum strip, zinc strip, copper strip, glass strip or ceramic strip.

The invention claimed is:

1. A vacuum deposition facility for continuously depositing, on a running substrate, coatings formed from metal or metal alloy, the facility comprising:
    a vacuum chamber including:
        a central casing having a substrate entry and a substrate exit located on two opposite sides of the central casing and a vapor jet coater, the vapor jet coater configured to spray metal or metal alloy vapors onto the substrate, inner walls of the central casing configured to be heated at a temperature above a condensation temperature of the metal or metal alloy vapors; and
        a vapor trap in a form of an external casing located at the substrate exit of the central casing, vapor trap inner walls configured to be maintained at a temperature below the condensation temperature of the metal or metal alloy vapors,
    a substrate path in the vacuum chamber through the central casing and the vapor trap,
    a passage linking the central casing to the vapor trap including at least one thermal connector comprising an inward end and an outward end, the at least one thermal connector inserted into the substrate exit of the central casing such that outer walls of the central casing and outer walls of the vapor trap directly contact, the thermal connector extending from the outer walls of the vapor trap to the inner walls of the central casing.

2. The vacuum deposition facility as recited in claim 1, wherein the thermal connector includes a monobloc metallic piece.

3. The vacuum deposition facility as recited in claim 2, wherein the metallic piece is made of a metal with a thermal conductivity above 20 W·m$^{-1}$K$^{-1}$.

4. The vacuum deposition facility as recited in claim 3, wherein the metallic piece is made of copper.

5. The vacuum deposition facility as recited in claim 1, wherein a thickness of the thermal connector is between 6 and 18 mm.

6. The vacuum deposition facility as recited in claim 1, wherein the thermal connector has a uniform cross-sectional shape and extends over an entire width of the substrate exit of the central casing.

7. The vacuum deposition facility as recited in claim 1, wherein the thermal connector has a rectangular cross-section.

8. The vacuum deposition facility as recited in claim 1, wherein the thermal connector protrudes in an inward direction from the inner walls of the central casing by at least 4 mm.

9. The vacuum deposition facility as recited in claim 1, wherein the outward end of the thermal connector does not extend beyond a plane of one of the vapor trap inner walls at an inward end of the vapor trap.

10. The vacuum deposition facility as recited in claim 1, wherein the central casing includes a local heater adjacent the thermal connector.

11. The vacuum deposition facility as recited in claim 1, further comprising a second vapor trap located at the substrate entry of the central casing.

12. The vacuum deposition facility as recited in claim 1, wherein the at least one thermal connector includes two thermal connectors, one below the substrate path of the substrate and the other one above the substrate path.

13. The vacuum deposition facility as recited in claim 1, wherein the outward end of the thermal connector protrudes from the vapor trap to a position inside the central casing and is in contact with the outer walls of the central casing.

14. The vacuum deposition facility according to claim 1, further comprising a heater, the heater heating the inner walls of the central casing to the temperature above the condensation temperature of the metal or metal alloy vapors.

15. The vacuum deposition facility according to claim 1, wherein the vapor jet coater is a sonic vapor jet coater.

16. The vacuum deposition facility according to claim 15, wherein the sonic vapor jet coater is coupled to an induction-heated evaporation crucible or an electromagnetic levitation vapor generator.

17. The vacuum deposition facility according to claim 1, wherein the coatings formed from metal or metal alloy are zinc or zinc magnesium coatings.

18. The vacuum deposition facility according to claim 1, wherein the coatings formed from metal or metal alloy comprise zinc, as a main element, and chromium, nickel, titanium, manganese, magnesium, silicium, aluminum and combinations thereof, as an additional element.

19. The vacuum deposition facility according to claim 1, wherein the at least one thermal connector conducts heat from the central casing to the vapor trap while keeping the at least one thermal connector in contact with the central casing at the temperature above the condensation temperature of the metal or metal alloy vapors.

20. The vacuum deposition facility according to claim 1, wherein the at least one thermal connector is heated by radiation in the central casing and heat is transmitted by conduction to the vapor trap.

21. The vacuum deposition facility according to claim 1, wherein the at least one thermal connector is thicker than sides of the vapor trap.

22. The vacuum deposition facility according to claim 1, wherein the vapor trap, in longitudinal cross-section, comprises a trapezoid shape pointing in a direction opposite to the central casing.

23. The vacuum deposition facility according to claim 1, wherein the vapor trap inner walls are maintained at a temperature below 100° C.

24. The vacuum deposition facility according to claim 1, wherein the at least one thermal connector comprises a solid metallic piece.

25. The vacuum deposition facility according to claim 1, wherein the outer walls of the central casing and the outer walls of vapor trap are aligned and define a plane of contact between the central casing and the vapor trap.

26. The vacuum deposition facility according to claim 1, wherein the inward end is protruding in an inward direction past the inner walls of the central casing.

27. A vacuum deposition facility for continuously depositing, on a running substrate, coatings formed from metal or metal alloy, the facility comprising:
   a vacuum chamber including:
      a central casing having a substrate entry and a substrate exit located on two opposite sides of the central casing and a vapor jet coater, the vapor jet coater configured to spray metal or metal alloy vapors onto the substrate, inner walls of the central casing configured to be heated at a temperature above a condensation temperature of the metal or metal alloy vapors; and
      a vapor trap in a form of an external casing located at the substrate exit of the central casing, vapor trap inner walls configured to be maintained at a temperature below the condensation temperature of the metal or metal alloy vapors,
   a substrate path in the vacuum chamber through the central casing and the vapor trap, a passage linking the central casing to the vapor trap including at least one thermal connector extending from the inner walls of the central casing to the vapor trap inner walls,
   wherein the thermal connector comprises an inward end and an outward end, the inward end is inserted into the central casing such that outer walls of the central casing and outer walls of the vapor trap directly contact, and the inward end is protruding in an inward direction from the inner walls of the central casing to a position inside the central casing, and the outward end is in contact with the outer walls of the vapor trap.

28. The vacuum deposition facility as recited in claim 27, wherein the outward end of the thermal connector does not extend beyond a plane of one of the vapor trap inner walls at an inward end of the vapor trap.

29. The vacuum deposition facility as recited in claim 27, wherein the thermal connector protrudes from an inside of the central casing through the substrate exit to the outer walls of the vapor trap.

30. The vacuum deposition facility according to claim 27, wherein the outer walls of the central casing and the outer walls of vapor trap are aligned and define a plane of contact between the central casing and the vapor trap.

31. A kit for the assembling of a vacuum deposition facility for continuously depositing, on a running substrate, coatings formed from metal or metal alloy, the kit comprising:
   a central casing including a substrate entry and a substrate exit located on two opposite sides of the central casing and including a vapor outlet orifice of a vapor jet coater, the vapor jet coater configured to spray metal or metal alloy vapors onto the substrate, inner walls of the central casing configured to be heated at a temperature above the condensation temperature of the metal or metal alloy vapors,
   a vapor trap in the form of an external casing located at the substrate exit of the central casing, vapor trap inner walls configured to be maintained at a temperature below the condensation temperature of the metal or metal alloy vapors, and a thermal connector comprising an inward end and an outward end, the thermal connector configured to link the central casing to the vapor trap such that outer walls of the central casing and outer walls of the vapor trap directly contact and such that the inward end extends from the outer walls of the vapor trap through the substrate exit of the central casing in an inward direction toward an inside of the central casing.

\* \* \* \* \*